(12) United States Patent
Han et al.

(10) Patent No.: US 12,000,888 B2
(45) Date of Patent: Jun. 4, 2024

(54) INTEGRATED CIRCUIT INCLUDING TEST CIRCUIT AND METHOD OF MANUFACTURING THE SAME

(71) Applicant: Samsung Electronics Co., Ltd., Suwon-si (KR)

(72) Inventors: Changho Han, Hwaseong-si (KR); Mijeong Lim, Seoul (KR); Yuncheol Kim, Hwaseong-si (KR); Kwanghun Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 17/857,379

(22) Filed: Jul. 5, 2022

(65) Prior Publication Data
US 2023/0049110 A1 Feb. 16, 2023

(30) Foreign Application Priority Data

Aug. 11, 2021 (KR) .................... 10-2021-0106181

(51) Int. Cl.
| | | |
|---|---|---|
| *G01R 31/317* | (2006.01) | |
| *G01R 31/30* | (2006.01) | |
| *G01R 31/3173* | (2006.01) | |
| *G01R 31/3177* | (2006.01) | |
| *G01R 31/3183* | (2006.01) | |
| *G01R 31/3185* | (2006.01) | |
| *H01L 21/66* | (2006.01) | |

(52) U.S. Cl.
CPC ... *G01R 31/31725* (2013.01); *G01R 31/3016* (2013.01); *G01R 31/31715* (2013.01);
(Continued)

(58) Field of Classification Search
CPC .......... G01R 31/31725; G01R 31/3016; G01R 31/31715; G01R 31/31727;
(Continued)

(56) References Cited

U.S. PATENT DOCUMENTS

| | | | | |
|---|---|---|---|---|
| 5,811,983 A | * | 9/1998 | Lundberg | ........... G01R 31/2882 324/762.01 |
| 7,109,734 B2 | * | 9/2006 | Yuan | .............. G01R 31/318516 324/762.03 |

(Continued)

FOREIGN PATENT DOCUMENTS

| | | |
|---|---|---|
| JP | 2003023055 A | 1/2003 |
| KR | 100849208 B1 | 7/2008 |

OTHER PUBLICATIONS

Sen et al., Parasitic Extraction Tool Verification using an Automatically Generated Set of Ring Oscillators, Jan. 1, 2005, IEEE, pp. 1-4. (Year: 2005).*

(Continued)

*Primary Examiner* — John J Tabone, Jr.
(74) *Attorney, Agent, or Firm* — Muir Patent Law, PLLC

(57) ABSTRACT

An integrated circuit includes first to $n^{th}$ metal layers vertically stacked on a substrate, and a test circuit outputting a test result signal according to a characteristic of each of the first to $n^{th}$ metal layers. The test circuit includes first to $n^{th}$ test circuits for generating a plurality of clock signals. Each clock signal of the plurality of clock signal has a frequency according to a characteristic of a corresponding metal layer among the first to $n^{th}$ metal layers, and n is a natural number.

18 Claims, 14 Drawing Sheets

(52) U.S. Cl.
CPC ... *G01R 31/31727* (2013.01); *G01R 31/3173* (2013.01); *G01R 31/3177* (2013.01); *G01R 31/318314* (2013.01); *H01L 22/34* (2013.01); *G01R 31/318513* (2013.01)

(58) Field of Classification Search
CPC ............ G01R 31/3173; G01R 31/3177; G01R 31/318314; G01R 31/318513; H01L 22/34
USPC .............. 714/731, 734; 326/76.39, 681, 711, 326/750.3, 678, 686, 436, 442; 716/113
See application file for complete search history.

(56) References Cited

U.S. PATENT DOCUMENTS

| | | | |
|---|---|---|---|
| 7,659,126 B1 * | 2/2010 | Smith ............ | G01R 31/318511 324/762.05 |
| 7,791,357 B2 | 9/2010 | Pavithran et al. | |
| 7,973,541 B2 | 7/2011 | Jayapalan et al. | |
| 9,608,602 B2 * | 3/2017 | Liu ......................... | G06F 30/39 |
| 2003/0146771 A1 * | 8/2003 | Moore ............... | G01R 31/2884 324/762.03 |
| 2005/0041454 A1 * | 2/2005 | Schultz ................. | G01R 33/18 365/91 |
| 2008/0094053 A1 * | 4/2008 | Han ................. | G01R 31/31727 324/76.39 |
| 2020/0132752 A1 * | 4/2020 | Wang ................... | H03K 3/0315 |
| 2023/0049110 A1 * | 2/2023 | Han ................. | G01R 31/31727 |

OTHER PUBLICATIONS

Jin et al., Built-In-Self-Test 3-D Ring Oscillator for Stacked 3DIC, 2014, IEEE, pp. 1-3 (Year: 2014).*

Chun-Chen Liu et al., "An Accurate Interconnect Test Structure for Parasitic Validation in On-Chip Machine Learning Accelerators," 2017.

* cited by examiner

US 12,000,888 B2

INTEGRATED CIRCUIT INCLUDING TEST CIRCUIT AND METHOD OF MANUFACTURING THE SAME

CROSS-REFERENCE TO RELATED APPLICATION

This application is based on and claims priority under 35 U.S.C. § 119 to Korean Patent Application No. 10-2021-0106181, filed on Aug. 11, 2021, in the Korean Intellectual Property Office, the disclosure of which is incorporated by reference herein in its entirety.

BACKGROUND

The inventive concept relates to an integrated circuit including a test circuit and a method of manufacturing the integrated circuit.

As semiconductors have become highly integrated and miniaturized, factors of each of steps for designing and manufacturing semiconductor devices may affect performance of the semiconductors in a complex manner, and thus, various unintended electrical characteristics have occurred in the semiconductor devices. In order to meet a product specification of a semiconductor device, it is desirable to estimate the characteristics of the semiconductor device.

A modeling scheme may be used to estimate an object or phenomenon having a causal relationship, and a model generated using the modeling scheme may be used to estimate or optimize the object or phenomenon. For example, a machine learning model may be generated by training (or learning) based on massive sample data.

SUMMARY

The inventive concept provides an integrated circuit in which the timing characteristics of the integrated circuit may be more accurately estimated by extracting the electrical characteristics of metal layers formed in the integrated circuit, and a method of manufacturing the integrated circuit.

According to an embodiment of the inventive concept, there is provided an integrated circuit including first to $n^{th}$ metal layers vertically stacked on a substrate, and a test circuit outputting a test result signal according to a characteristic of each of the first to $n^{th}$ metal layers. The test circuit comprises first to $n^{th}$ test circuits for generating a plurality of clock signals. Each clock signal of the plurality of clock signals has a frequency according to a characteristic of a corresponding metal layer among the first to $n^{th}$ metal layers, and n is a natural number.

According to an embodiment of the inventive concept, there is provided an integrated circuit including a test circuit. The test circuit includes a first ring oscillator including a plurality of inverters connected with each other using a first test pattern formed in a first metal layers among a plurality of metal layers that are vertically stacked on each other, and a second ring oscillator including a plurality of inverters connected with each other using a second test pattern formed in the first metal layer. An extension length of the at least one first test pattern of the first metal layer and an extension length of the at least one second test pattern of the first metal layer are different from each other.

According to an embodiment of the inventive concept, there is provided a method of manufacturing an integrated circuit including a plurality of metal layers, the method including obtaining frequencies of test result signals by ring oscillators each comprising test patterns formed in a specific metal layer among the plurality of metal layers, and extracting a resistance value and a capacitance value of a pattern formed in the specific metal layer by performing machine learning on the frequencies of the test result signals.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
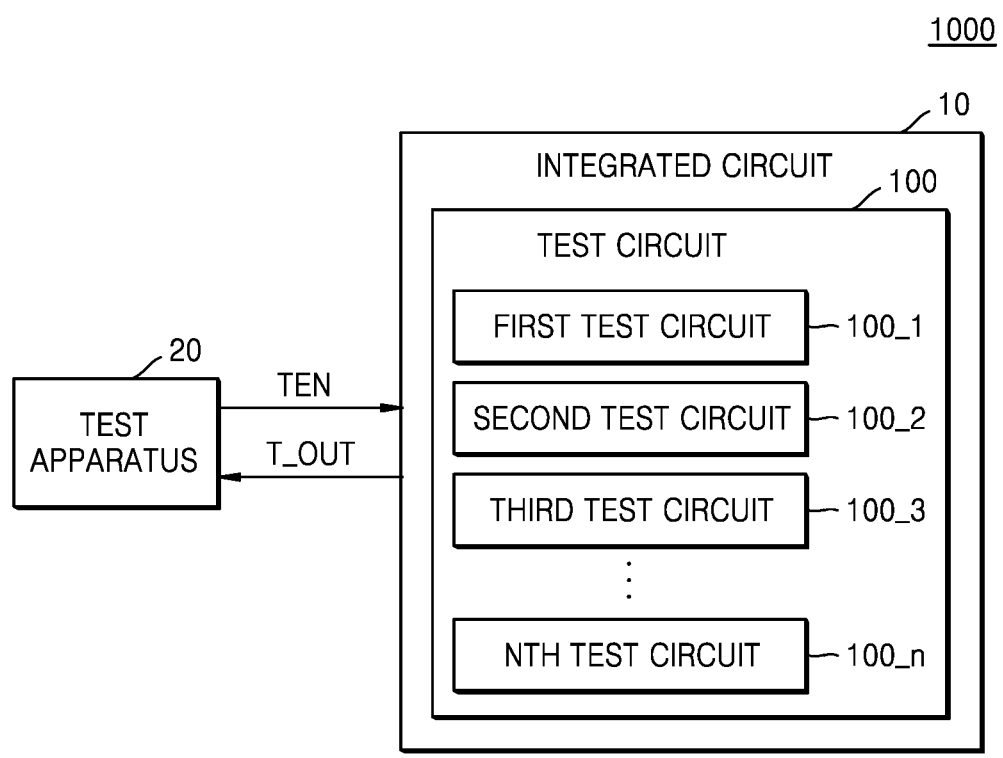
FIG. 1 is a block diagram of a test system according to an embodiment of the inventive concept.
Figure 2:
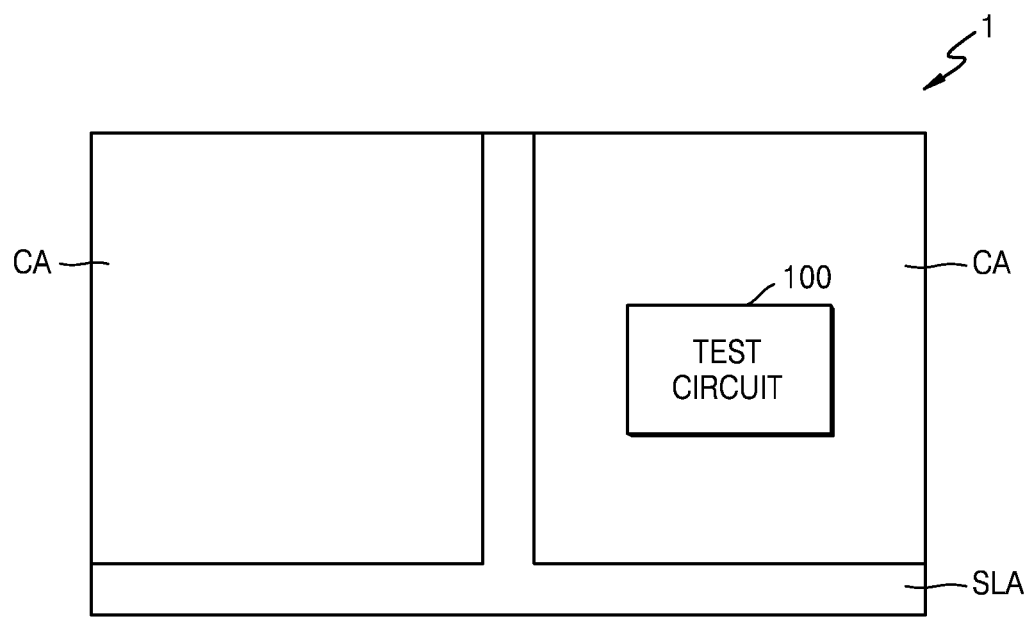
FIG. 2 is a planar view illustrating a wafer on which an integrated circuit is formed, according to an embodiment of the inventive concept.

FIG. 1 is a block diagram of a test system 1000 according to an embodiment of the inventive concept. FIG. 2 is a planar view illustrating a wafer 1 on which an integrated circuit is formed, according to an embodiment of the inventive concept.

Referring to FIG. 1, the test system 1000 may include a test apparatus 20 and an integrated circuit 10. For example, the integrated circuit 10 may be implemented as a semiconductor package, and the semiconductor package may include a substrate and a plurality of integrated circuit devices mounted on the substrate. For example, the integrated circuit devices may include a memory semiconductor device or a logic semiconductor device. The logic semiconductor device may constitute, for example, a central processing unit (CPU), a graphics processing unit (GPU), a controller, an application specific integrated circuit (ASIC), or an application processor (AP). The memory semiconductor device may include, for example, dynamic random access memory (DRAM), static random access memory (SRAM), flash memory, electrically erasable and programmable read-only memory (EEPROM), phase-change random access memory (PRAM), magnetic random access memory (MRAM), or resistive random access memory (RRAM).

The test apparatus 20 may output a test enable signal TEN to the integrated circuit 10 to test (i.e., evaluate or measure) electrical characteristics of the integrated circuit 10. The integrated circuit 10 may output a test result signal T_OUT in response to the test enable signal TEN. The test result signal T_OUT may have a frequency corresponding to electrical characteristics of each of metal layers formed in the integrated circuit 10.

The integrated circuit 10 may include a test circuit 100 configured to generate the test result signal T_OUT according to the electrical characteristics of the metal layers of the integrated circuit 10. The test circuit 100 may include, for example, first to $n^{th}$ test circuits 100_1 to 100_$n$. Each of the first to $n^{th}$ test circuits 100_1 to 100_$n$ may generate a corresponding clock signal according to an electrical characteristic of a corresponding metal layer from among the first to $n^{th}$ metal layers formed in the integrated circuit 10.

The test apparatus 20 may receive the test result signal T_OUT with a frequency corresponding to the clock signals. The test apparatus 20 may extract the frequency of the test result signal T_OUT and extract, from the extracted frequency, a resistance value and capacitance value of each of the first to $n^{th}$ metal layers formed in the integrated circuit 10 through machine learning. The test apparatus 20 may estimate timing characteristics of integrated circuit devices of the integrated circuit 10 by using the extracted resistance value and capacitance value, and determine whether the integrated circuit 10 is defective. If the estimated timing characteristics do not meet a target value or range, the test apparatus 20 may determine that the integrated circuit 10 is defective.

Referring to FIGS. 1 and 2, the wafer 1 may include semiconductor chip areas CA and a scribe lane region SLA. The semiconductor chip areas CA may be cut along the scribe lane region SLA to form individual semiconductor chips. The scribe lane area SLA may refer to an area in which a surface of the wafer 1 may be to be horizontally or vertically cut by a diamond cutter or a laser so as to divide the wafer 1 into multiple chips, the wafer 1 having integrated circuit devices formed thereon. The integrated circuit devices included in the integrated circuit 10 may be formed in the semiconductor chip area CA.

The test circuit 100 may be formed in the semiconductor chip area CA. Because the scribe lane area SLA and the semiconductor chip area CA are different from each other with respect to the density of a pattern of a metal layer, the test circuit 100 for analyzing the timing characteristics of the integrated circuit devices included in the integrated circuit 10 is formed in the semiconductor chip area CA rather than the scribe lane area SLA, so that characteristics of metal layers formed in the semiconductor chip area CA may be directly tested. Accordingly, the electrical characteristics and timing characteristics of the integrated circuit 10 may be more accurately estimated.

The wafer 1 may include or may be formed of at least one semiconductor material selected from the group consisting of silicon (Si), germanium (Ge), silicon-germanium (SiGe), gallium phosphide (GaP), gallium arsenide (GaAs), silicon carbide (SiC), silicon-germanium-carbon (SiGeC), indium arsenide (InAs), and indium phosphide (InP). In addition, the wafer 1 may include a rigid substrate such as a silicon substrate, a silicon on insulator (SOI) substrate, a GaAs substrate, a SiGe substrate, a ceramic substrate, a quartz substrate, or a glass substrate for display, or may include a flexible plastic substrate including polyimide, polyester polycarbonate, polyethersulfone, poly(methyl methacrylate), polyethylene naphthalate, and polyethylene terephthalate.

The wafer 1 may include a first conductivity-type (for example, p-type) substrate, and may be formed by growing an epitaxial layer of the first conductivity type (for example, p-type) and etching the epitaxial layer. In some embodiments, the wafer 1 may be formed by etching the first conductivity-type (for example, p-type) substrate itself.

Figure 3:
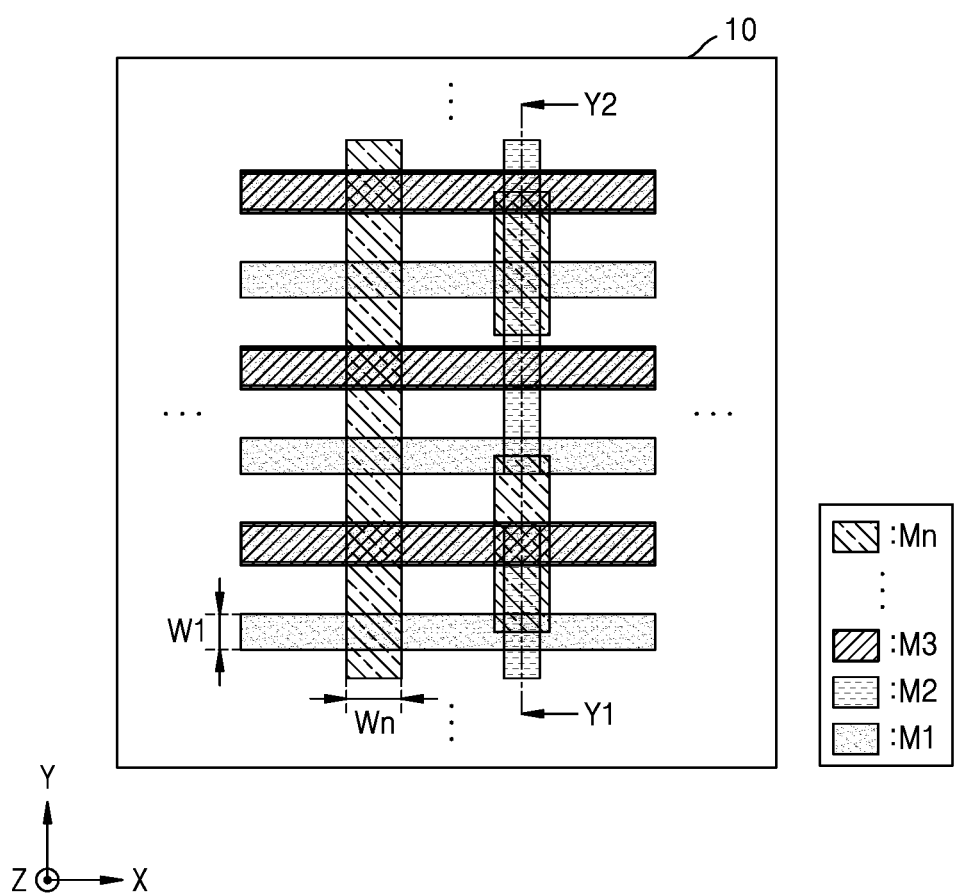
FIGS. 3 and 4 are diagrams illustrating metal layers formed in an integrated circuit according to an embodiment of the inventive concept.
Figure 4:
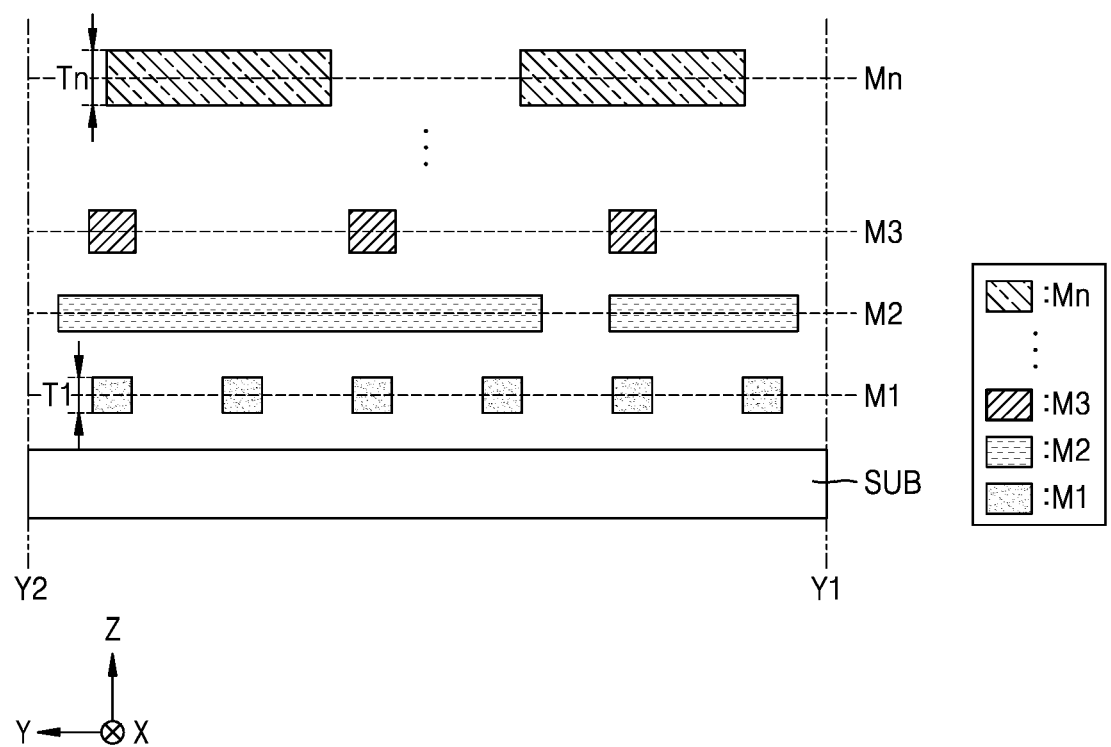

FIGS. 3 and 4 are diagrams illustrating metal layers formed in the integrated circuit 10 according to an embodiment of the inventive concept. FIG. 4 is a cross-sectional view of the metal layers taken along line Y1-Y2 of FIG. 3.

Referring to FIGS. 3 and 4, the integrated circuit 10 may include a plurality of metal layers, in which lines for connecting integrated circuit devices with each other are formed. The lines of the plurality of metal layers may be formed by a back-end-of-line (BEOL) process. The plurality of metal layers may include first to $n^{th}$ metal layers M1 to Mn, which are sequentially stacked in a vertical direction (for example, a Z-axis direction) on a substrate SUB.

The substrate SUB may include or may be formed of a semiconductor including Si, Ge, or Group III-V compounds such as GaAs, aluminum gallium arsenide (AlGaAs), InAs, indium gallium arsenide (InGaAs), indium antimonide (InSb), gallium antimonide (GaSb), indium gallium antimonide (InGaSb), InP, GaP, indium gallium phosphide (InGaP), indium nitride (InN), gallium nitride (GaN), and indium gallium nitride (InGaN). In an example embodiment, the substrate SUB may include or may be an SOI substrate or a germanium-on-insulator (GOI) substrate. In an example embodiment, the substrate SUB may be doped with p-type impurities. An active area may be formed in the substrate SUB, and a transistor with a gate line may be formed at the active area.

The second metal layer M2 may be formed on the first metal layer M1, the third metal layer M3 may be formed on the second metal layer M2, and the $n^{th}$ metal layer Mn may be formed on the third metal layer M3. For example, n may be 12, and the integrated circuit 10 may include twelve metal layers. The present invention is not limited thereto. In some embodiments, the integrated circuit 10 may have more than 12 metal layers or less than 12 metal layers.

In an example embodiment, each of the first to $n^{th}$ metal layers M1 to Mn may include corresponding patterns that extend unidirectionally, and directions in which patterns formed in adjacent metal layers may be perpendicular to each other. For example, the first metal layer M1 may include patterns extending in an X-axis direction, the second metal layer M2 may include patterns extending in a Y-axis direction, and the third metal layer M3 may include patterns extending in the X-axis direction. However, the integrated circuit 10 according to the inventive concept is not limited thereto, and each of the first to $n^{th}$ metal layers M1 to Mn may include patterns extending in various directions.

The patterns formed in each of the first to $n^{th}$ metal layers M1 to Mn may include or may be formed of metal, a conductive metal nitride, a metal silicide, or any combinations thereof. In some embodiments, the first to $n^{th}$ metal layers M1 to Mn may all include the same material as each other. For example, each of the patterns formed in the first to $n^{th}$ metal layers M1 to Mn may include or may be formed of copper (Cu). In the drawings of the present specification, only some layers are shown, for convenience of illustration. The integrated circuit 10 may include a via that electrically connects a pattern of a specific metal layer to a pattern of a higher metal layer thereof, or may include a via that electrically connects the pattern of the specific metal layer to a lower metal layer thereof.

In an example embodiment where a first metal layer M1, the lowest metal layer among the first to $n^{th}$ metal layers M1 to Mn, extends along the X-axis, nth metal layer Mn, the highest metal layer, among the first to nth metal layers M1 to Mn, extends along the Y-axis, and the other metal layers alternately extend along the Y-axis and the X-axis, widths, in a horizontal direction (for example, the X-axis direction or the Y-axis direction) of the substrate SUB, of the first to $n^{th}$ metal layers M1 to Mn, may increase from a lower metal layer to a higher metal layer. In some embodiments, a width W1 of the patterns of the first metal layer M1, which is the lowest metal layer, may be less than a width Wn of the pattern of the $n^{th}$ metal layer Mn, which is the highest metal layer. In some embodiments, when n is 12, a width of a pattern of the second metal layer M2 may be greater than the width W1 of the pattern of the first metal layer M1, widths of patterns of the second to fifth metal layers M2 to M5 may be the same as each other, a width of a pattern of the sixth metal layer M6 may be greater than a width of a pattern of a fifth metal layer M5, and widths of patterns of the sixth to twelfth metal layers may be the same as each other. The odd-numbered metal layers (e.g., metal layers M1, M3, . . . , and Mn–1) may have widths in the Y-axis, and the even-numbered metal layers (e.g., metal layers M2, M4, . . . , and Mn) may have widths in the X-axis perpendicular to the Y-axis. The present invention is not limited thereto. In some embodiments, the nth metal layer Mn, which is the highest metal layer, may be the odd-numbered metal layer, and may extend along the X-layer.

In an embodiment, thicknesses, in a vertical direction (the Z-axis direction) of the substrate SUB, of the first to $n^{th}$ metal layers M1 to Mn, may increase from a lower metal layer to a higher metal layer. In some embodiments, a thickness T1 of the pattern of the first metal layer M1, which is the lowest metal layer, may be less than a thickness Tn of the pattern of the $n^{th}$ metal layer Mn, which is the highest metal layer. In some embodiments, when n is 12, a thickness of a pattern of the second metal layer M2 may be greater than the thickness T1 of the pattern of the first metal layer M1, thicknesses of patterns of the second to fifth metal layers M2 to M5 may be the same as each other, a thickness of a pattern of the sixth metal layer M6 may be greater than a thickness of a pattern of a fifth metal layer M5, and thicknesses of patterns of the sixth to twelfth metal layers may be the same as each other.

Figure 5:
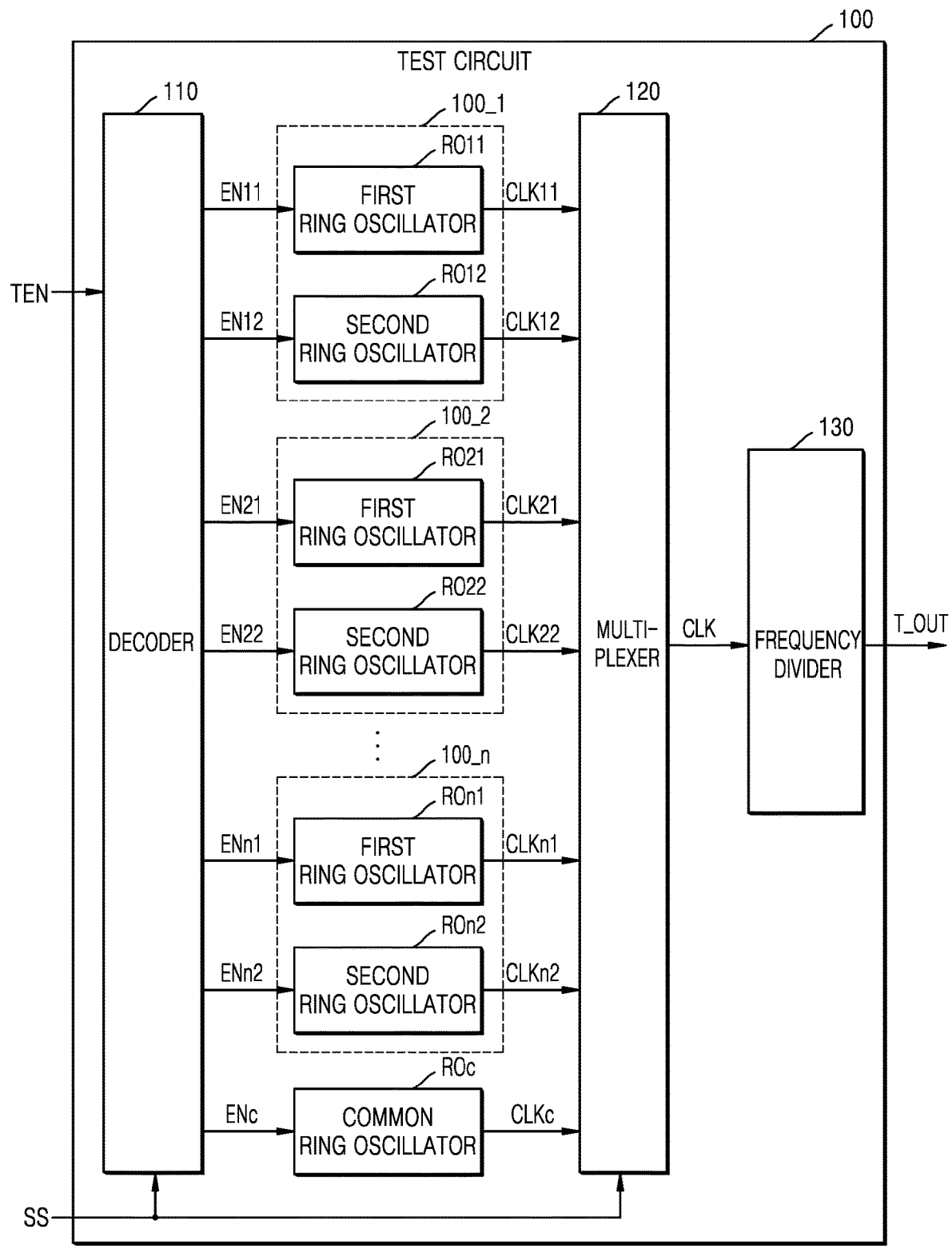
FIG. 5 is a block diagram of test circuits of an integrated circuit according to an embodiment of the inventive concept.

FIG. 5 is a block diagram of a test circuit 100 of an integrated circuit according to an embodiment of the inventive concept.

Referring to FIG. 5, the test circuit 100 may include a decoder 110, first to $n^{th}$ test circuits 100_1 to 100_n, a common ring oscillator ROc, a multiplexer 120, and a frequency divider 130. However, unlike shown in FIG. 5, the test circuit 100 may not include at least one of the decoder 110, the multiplexer 120, and the frequency divider 130.

The decoder 110 may receive a test enable signal TEN, and provide, in response to a selection signal SS, an enable signal (for example, at least one of EN11 to ENn1, EN12 to ENn2, and ENc) to a ring oscillator corresponding to the selection signal SS. In some embodiments, the decoder 110 may receive the test enable signal TEN and decode the test enable signal TEN to generate the enable signal in response to the selection signal SS. The test enable signal TEN and the selection signal SS may be received from the test apparatus (20 of FIG. 1). For example, in response to the selection signal SS, the decoder 110 may transmit the first and second enable signals EN11 and EN12 to the first test circuit 100_1, transmit the first and second enable signals EN21 and EN22 to the second test circuit 100_2, transmit the first and second enable signals ENn1 and ENn2 to the $n^{th}$ test circuit 100_n, and transmit the common enable signal ENc to the common ring oscillator ROc. In some embodiments, the enable signal EN11 to Enn1 and EN12 to Enn2 may simultaneously be transmitted. In some embodiments, the enable signal EN11 to Enn1 and EN12 to Enn2 may sequentially be transmitted. In some embodiments, the enable signal EN11 to Enn1 and EN12 to Enn2 may selectively be transmitted.

Each of the first to $n^{th}$ test circuits 100_1 to 100_n may be provided to detect electrical characteristics of a pattern formed in a corresponding metal layer from among the first to $n^{th}$ metal layers (M1 to Mn of FIG. 3). Each of the first to $n^{th}$ test circuits 100_1 to 100_n may include at least two ring oscillators. Each of the first to $n^{th}$ test circuits 100_1 to 100_n may include a first ring oscillator (corresponding one among RO11 to ROn1) and a second ring oscillator (corresponding one among RO12 to ROn2). In FIG. 5, each of the first to $n^{th}$ test circuits 100_1 to 100_n includes two ring oscillators. However, the test circuit 100 according to the inventive concept is not limited thereto, and each of the first to $n^{th}$ test circuits 100_1 to 100_n may include three or more ring oscillators. In some embodiments, a number of the test circuits may be the same as a number of the metal layers. In some embodiments, a number of the test circuit may be less than a number of the metal layers.

To measure electrical characteristics of the first metal layer M1, the first test circuit 100_1 may include a first ring oscillator RO11 and a second ring oscillator RO12 each including a test pattern to be formed in the first metal layer M1. A length in which the test pattern included in the first ring oscillator RO11 extends may be different from a length in which the test pattern included in the second ring oscillator RO12.

The first ring oscillator RO11 of the first test circuit 100_1 may output a first clock signal CLK11 in response to a first enable signal EN11 received from the decoder 110. The second ring oscillator RO12 of the first test circuit 100_1 may output a second clock signal CLK12 in response to the second enable signal EN12 received from the decoder 110. A frequency of the first clock signal CLK11 and a frequency of the second clock signal CLK12 may be changed according to the electrical characteristics (for example, a resistance value and a capacitance value) of the first metal layer M1.

To measure electrical characteristics of the second metal layer M2, the second test circuit 100_2 may include a first ring oscillator RO21 and a second ring oscillator RO22 each including a test pattern to be formed in the second metal layer M2. A length in which the test pattern included in the first ring oscillator RO21 extends may be different from a length in which the test pattern included in the second ring oscillator RO22 extends.

The first ring oscillator RO21 of the second test circuit 100_2 may output a first clock signal CLK21 in response to the first enable signal EN21 received from the decoder 110. The second ring oscillator RO22 of the second test circuit 100_2 may output a second clock signal CLK22 in response to the second enable signal EN22 received from the decoder 110. A frequency of the first clock signal CLK21 and a frequency of the second clock signal CLK22 may be changed according to the electrical characteristics of the second metal layer M2.

In order to measure electrical characteristics of the $n^{th}$ metal layer Mn, the $n^{th}$ test circuit 100_n may include a first ring oscillator Ron1 and a second ring oscillator Ron2, each including a test pattern to be formed in the $n^{th}$ metal layer Mn. A length in which the test pattern included in the first ring oscillator Ron1 extends may be different from a length in which the test pattern included in the second ring oscillator Ron2 extends.

The first ring oscillator Ron1 of the $n^{th}$ test circuit 100_n may output a first clock signal CLKn1 in response to the first enable signal Enn1 received from the decoder 110. The second ring oscillator Ron2 of the $n^{th}$ test circuit 100_n may output a second clock signal CLKn2 in response to the second enable signal Enn2 received from the decoder 110. A frequency of the first clock signal CLKn1 and a frequency of the second clock signal CLKn2 may be changed according to the electrical characteristics of the $n^{th}$ metal layer Mn.

The common ring oscillator Roc may be provided to detect electrical characteristics of patterns formed in the first to $n^{th}$ metal layers M1 to Mn. The common ring oscillator Roc may output a common clock signal CLKc in response to the common enable signal Enc. The common clock signal CLKc may be used to extract electrical characteristics of each of the patterns formed in the first to $n^{th}$ metal layers M1 to Mn. The common ring oscillator Roc may include a test pattern to be formed in one of the first to $n^{th}$ metal layers M1 to Mn. For example, the common ring oscillator Roc may include a test pattern to be formed in the third metal layer M3.

The multiplexer may receive first clock signals CLK11 to CLKn1, second clock signals CLK12 to CLKn2, and the common clock signal CLKc, and output, in response to the selection signal SS, a signal corresponding to the selection signal SS from among the first clock signals CLK11 to CLKn1, the second clock signals CLK12 to CLKn2, and the common clock signal CLKc as a clock signal CLK.

The frequency divider 130 may receive the clock signal CLK and divide a frequency of the clock signal CLK, and output a test result signal T_OUT that is downscaled (i.e., a test result signal with a frequency lower than a frequency of the clock signal CLK). The frequency divider 130 may adjust the frequency of the clock signal CLK to a frequency suitable for analysis in the test apparatus 20, and output the clock signal of which the frequency is adjusted as the test result signal T_OUT. For example, when the clock signal CLK has a frequency in gigahertz units, the test result signal T_OUT may have a megahertz unit.

In FIG. 5, the test circuit 100 may have the plurality of oscillators (the first ring oscillators RO11 to ROn1, the second ring oscillators RO12 to ROn2, and the common ring oscillator ROc) for detecting the electrical characteristics of the patterns formed on the first to $n^{th}$ metal layers M1 to Mn. However, the test circuit 100 of the inventive concept is not limited thereto. In some embodiments, the test circuit 100 may further include additional oscillators for extracting characteristics (for example, a threshold voltage of the transistor, an on-voltage of the transistor, a current-voltage characteristics of the transistor, etc.) of transistors formed in the integrated circuit 10.

Figure 6A:
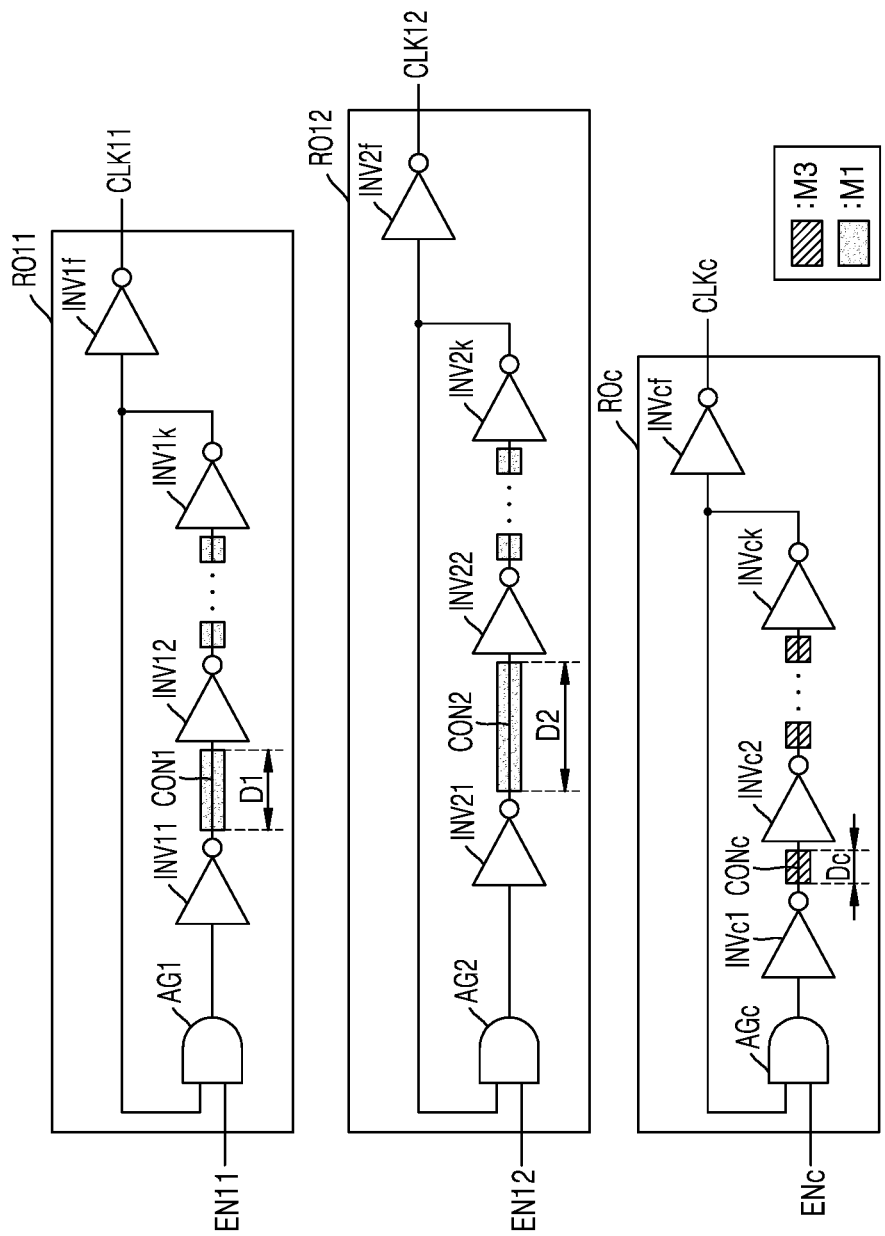
FIGS. 6A and 6B are diagrams illustrating ring oscillators of test circuits according to an embodiment of the inventive concept.
Figure 6B:
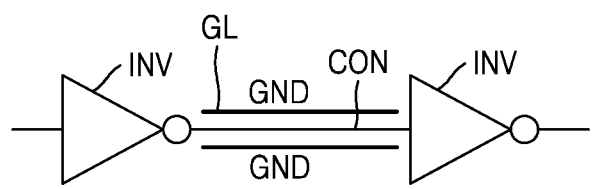
Figure 7:
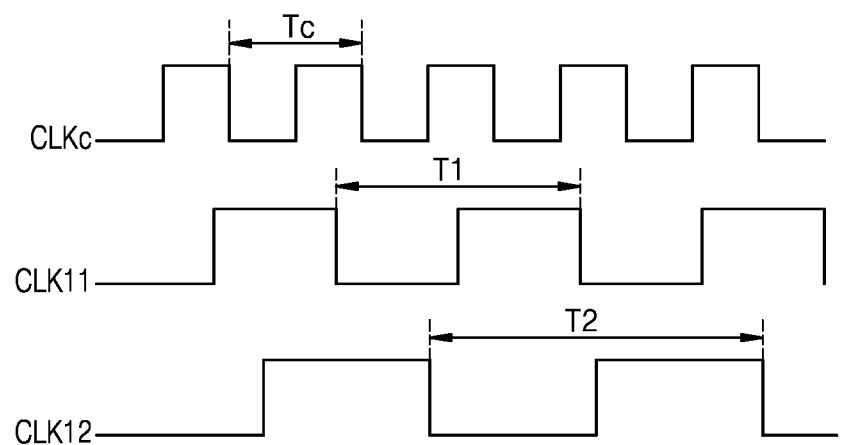
FIG. 7 is a timing diagram of frequencies of a first clock signal, a second clock signal, and a common clock signal, the first clock signal and the second clock signal being output from a first test circuit.

FIGS. 6A and 6B are diagrams illustrating ring oscillators of test circuits according to an embodiment of the inventive concept. FIG. 7 is a timing diagram of frequencies of a first clock signal, a second clock signal, and a common clock signal, the first clock signal and the second clock signal being output from the first test circuit 100_1. In FIG. 6A, for convenience of explanation, the first ring oscillator RO11 and the second ring oscillator RO12 included in the first test circuit 100_1 from among the first to $n^{th}$ test circuits 100_1 to 100_n are described. Descriptions of the first ring oscillator RO11 and the second ring oscillator RO12 of the first test circuit 100_1 may be applied in the same way to the first ring oscillator and the second ring oscillator included in each of the second to $n^{th}$ test circuits 100_2 to 100_n.

Referring to FIG. 6A, the first ring oscillator RO11 of the first test circuit 100_1 may include an AND circuit AG1 (i.e., an AND logic circuit), first to $k^{th}$ inverters INV11 to INV1k, and an output inverter INV1f. The AND circuit AG1 may receive the first enable signal EN11, and when the first enable signal EN11 is logic high, the first clock signal CLK11 toggling between a low level and a high level at a specific frequency may be output by the first to $k^{th}$ inverters INV11 to INV1k.

The first ring oscillator RO11 may include first test patterns CON1 which are formed on the first metal layer M1 to electrically connect the first to $k^{th}$ inverters INV11 to INV1k with each other. A length in which each of the first test patterns CON1 extends may be the same as a first length D1. For example, each first test pattern of the first test patterns CON1 may be disposed between corresponding two adjacent inverters and connect the two adjacent inverters with each other. In some embodiments, the first test patterns CON1 may have the same length and width as each other.

The second ring oscillator RO12 of the first test circuit 100_1 may include an AND circuit AG2 (i.e., an AND logic circuit), first to $k^{th}$ inverters INV21 to INV2k, and an output inverter INV2f. The AND circuit AG2 may receive the second enable signal EN12, and when the second enable signal EN12 is logic high, the second clock signal CLK12 toggling between a low level and a high level at a specific frequency may be output by the first to $k^{th}$ inverters INV21 to INV2k.

The second ring oscillator RO12 may include second test patterns CON2 which are formed on the first metal layer M1 to electrically connect the first to $k^{th}$ inverters INV21 to INV2k with each other. A length in which each of the second test patterns CON2 extends may be the same as a second length D2. For example, each second test pattern of the second test patterns CON2 may be disposed between corresponding two adjacent inverters and connect the two adjacent inverters with each other. In some embodiments, the second test patterns CON2 may have the same length and width as each other. In some embodiments, the first length D1 and the second length D2 may be different from each other, and the second length D2 may be greater than the first length D1. For example, the second length D2 may be about 70 μm, and the first length D1 may be about 10 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The common ring oscillator ROc may include an AND circuit AGc, first to $k^{th}$ inverters INVc1 to INVck, and an output inverter INVcf. The AND circuit AGc may receive the common enable signal ENc, and when the common enable signal ENc is logic high, the common clock signal CLKc toggling between a low level and a high level at a specific frequency may be output by the first to $k^{th}$ inverters INVc1 to INVck.

The common ring oscillator ROc may include common test patterns CONc which electrically connect the first to $k^{th}$ inverters INVc1 to INVck with each other and may be formed on one metal layer (for example, the third metal layer M3) from among the first to $n^{th}$ metal layers M1 to Mn. A length in which each of the common test patterns CONc extends may be the same as a third length Dc. For example, each common test pattern of the common test patterns CONc may be disposed between corresponding two adjacent inverters and connect the two adjacent inverters with each other. In some embodiments, the common test patterns CONc may have the same length and width as each other. In some embodiments, the third length Dc may be different from each of the first length D1 and the second length D2. In some embodiments, the third length Dc may be less than each of the first length D1 and the second length D2. For example, the third length Dc may be about 0.5 μm.

In an example embodiment, a length in which each of the common test patterns CONc included in the common ring oscillator Roc extends may be less than a length in which each of the test patterns included in other oscillators (for example, the first oscillators RO11 to ROn1 and the second oscillators RO21 to Ron2) included in the test circuit 100 extends.

Referring to FIGS. 6A and 6B, each of the ring oscillators (the first oscillators RO11 to ROn1, the second oscillators RO21 to ROn2, and the common oscillator ROc) included in the test circuit 100 may include a plurality of inverters INV, and may include test patterns CON electrically connecting the plurality of inverters INV with each other. Because the test system (1 of FIG. 1) extracts a resistance value and a capacitance value of patterns respectively formed on the first to nth metal layers M1 to Mn by using the test patterns CON, in order to accurately extract the capacitance value of the test patterns CON, a ground line GL may be arranged adjacent to the test patterns CON. A ground voltage GND may be applied to the ground line GL. In some embodiments, the ground line GL may serve as a shield line for the test patterns CON as shown in FIG. 6B.

Referring to FIGS. 6A and 7, lengths in which the first test pattern CON1, the second test pattern CON2, and the common test pattern CONc extend are the first length D1, the second length D2, and the third length Dc, respectively, which are different from each other, and thus, the first clock signal CLK11 output from the first ring oscillator RO11, the second clock signal CLK12 output from the second ring oscillator RO12, and the common clock signal CLKc output from the common ring oscillator ROc may differ in frequency from each other. For example, a first frequency 1/T1 of the first clock signal CLK11 may be less than a third frequency 1/Tc of the common clock signal CLKc, and a second frequency 1/T2 of the second clock signal CLK12 may be less than the first frequency 1/T1 of the first clock signal CLK11.

In addition to a length in which each of the first test pattern CON1 and the second test pattern CON2 extends, magnitudes of the first frequency 1/T1 and the second frequency 1/T2 may be determined by the resistance value and capacitance value of patterns formed on the first metal layer M1. Thus, the test apparatus (20 of FIG. 1) may estimate the resistance value and capacitance value of the patterns formed on the first metal layer M1 by using test result signals T_OUT corresponding to the first clock signal CLK11 and the second clock signal CLK12.

In some embodiments, the test apparatus 20 may estimate the resistance value and capacitance value of the patterns formed on the first metal layer M1 by using a test result signal T_OUT corresponding to the common clock signal CLKc together with the test result signals T_OUT corresponding to the first clock signal CLK11 and the second clock signal CLK12. Because the third length extended by each of the common test patterns CONc included in the common ring oscillator ROc is relatively short compared to the first length D1 and the second length D2, the third frequency 1/Tc of the common clock signal CLKc may be less affected by a difference in characteristics (for example, a difference in a width of the patterns and a difference in a thickness of the patterns described with reference to FIGS. 3 and 4) of the first to $n^{th}$ metal layers M1 to Mn. Accordingly, the test apparatus 20 may commonly use the test result signal T_OUT corresponding to the common clock signal CLKc to estimate the resistance values and capacitance values of the patterns formed on the first to $n^{th}$ metal layers M1 to Mn.

In an example embodiment, when n first to $n^{th}$ metal layers M1 to Mn are formed in the integrated circuit 10, a total of (2n+1) ring oscillators including the common ring oscillator ROc may be formed in the test circuit 100, in order to extract the characteristics of the metal layers. For example, each of metal layers excluding a metal layer (for example, the third metal layer M3) on which the common test patterns CONc of the common ring oscillator ROc are formed, from among the first to nth metal layers M1 to Mn, may include first test patterns and second test patterns each extending in a first length or a second length, and the third metal layer M3 on which the common test patterns CONc are formed may include the first test patterns extending in the first length, the second test patterns extending in the second length, and the common test patterns CONc extending in a third length. In order to extract electrical characteristics of a pattern of a specific metal layer from among a plurality of metal layers of the integrated circuit 10, the test apparatus 20 may use three test result signals T_OUT with different frequencies.

Configurations of the first ring oscillator RO11, the second ring oscillator RO12, and the common ring oscillator ROc shown in FIG. 6A are examples of ring oscillators, which are for convenience for explanation, and may be variously modified unlike as shown in FIG. 6A.

Figure 8:
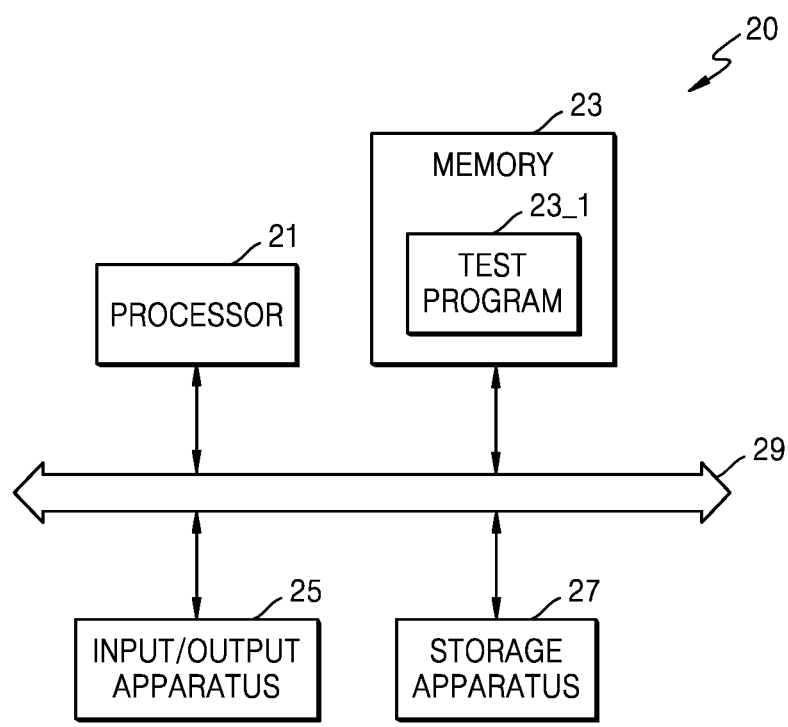
FIG. 8 is a block diagram of a test apparatus for testing an integrated circuit, according to an embodiment of the inventive concept.

FIG. 8 is a block diagram of a test apparatus 20 for testing an integrated circuit, according to an embodiment of the inventive concept.

Referring to FIG. 8, the test apparatus 20 may include a processor 21, a memory 23, an input/output apparatus 25, a storage apparatus 27, and a bus 29. For example, the test apparatus 20 may be provided as an apparatus for testing the characteristics of the integrated circuit 10. In some embodiment, the test apparatus 20 may be a computer for driving various programs, in addition to testing the characteristics of the integrated circuit 10. The test apparatus 20 may be a computing system such as desktop computers, workstations, or servers or a portable computing system such as laptop computers.

The processor 21 may be configured to execute instructions for performing at least one of various operations for testing the characteristics of the integrated circuit 10. The processor 21 may communicate with the memory 23, the input/output apparatus 25, and the storage apparatus 27 via the bus 29. The processor 21 may execute application programs loaded in the memory 23. For example, the processor 21 may execute a test program 23_1 loaded in the memory 23 and may perform machine learning. The test apparatus 20 may further include an additional processor for performing machine learning.

The memory 23 may store the test program 23_1 including instructions for testing the electrical characteristics and timing characteristics of the integrated circuit 10. In an example embodiment, a machine learning tool for extracting the electrical characteristics of an integrated circuit configuring the integrated circuit 10 may be loaded in the memory 23, and a simulation tool for estimating the timing characteristics of the integrated circuit from the extracted electrical characteristics may be loaded in the memory 23. For example, the electrical characteristics of the integrated circuit may include a resistance value and a capacitance value of a pattern of each of a plurality of metal layers formed in the integrated circuit.

The memory 23 may further store various tools in addition to the above. The memory 23 may be a volatile memory such as SRAM or DRAM, or may be a non-volatile memory such as PRAM, MRAM, ReRAM, ferroelectrics RAM (FRAM), or flash memory.

The input/output apparatus 25 may control a user input and output from user interface apparatuses. For example, the input/output apparatus 25 may include an input apparatus such as a keyboard, a mouse, and a touchpad, to receive integrated circuit design data. For example, the input/output apparatus 25 may include an output apparatus such as a display and a speaker, to display a simulation result.

The storage apparatus 27 may store a program such as the test program 23_1. The program or at least part of the program may be loaded in the memory 23 from the storage apparatus 27 before the program is executed by the processor 21. The storage apparatus 27 may store data to be processed by the processor 21 or data processed by the processor 21. For example, the storage apparatus 27 may store data (for example, a machine learning model, etc.) to be processed by a machine learning tool for extracting the electrical characteristics of an integrated circuit, and may store electrical characteristics data of an integrated circuit generated by the machine learning tool. The test program 23_1 may extract the electrical characteristics of the integrated circuit based on the machine learning model stored in the storage apparatus 27.

The storage apparatus 27 may include a non-volatile memory such as EEPROM, flash memory, PRAM, RRAM, MRAM, or FRAM, and may include a storage medium such as a memory card (a MutiMediaCard (MMC), an embedded MMC (eMMC), a Secure Digital (SD) card, a MicroSD card, etc.), a solid state drive (SSD), a hard disk drive (HDD), magnetic tape, an optical disk, and a magnetic disk.

The bus 29 may include a system bus for providing a network in a computer system. The processor 21, the memory 23, the input/output apparatus 25, and the storage apparatus 27 may be electrically connected to each other via the bus 29 to exchange data with each other. However, a configuration of the bus 29 is not limited to the bus 29 described above, and the bus 29 may further include mediation means for efficient management.

Figure 9:
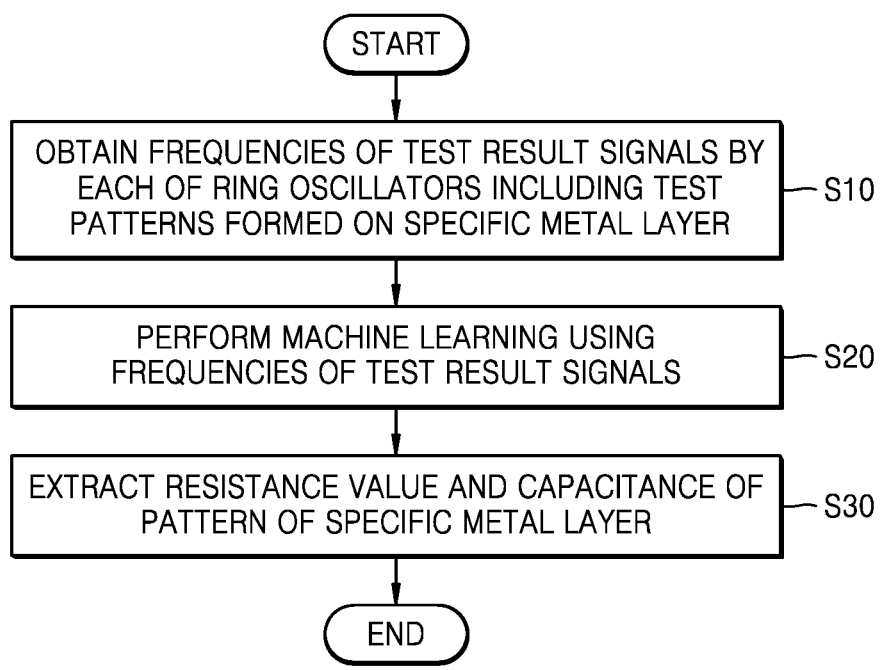
FIG. 9 is a flowchart of a method of manufacturing an integrated circuit, according to an embodiment of the inventive concept.

FIG. 9 is a flowchart of a method of manufacturing an integrated circuit, according to an embodiment of the inventive concept. Test circuits (100 of FIG. 5) including a plurality of ring oscillators RO11 to ROn1, RO12 to ROn2, and ROc may be formed in the integrated circuit. Operations S10 to S30 of FIG. 9 may be performed in the test apparatus 20 of FIG. 1. Before operations S10 to S30 are performed, an operation of receiving a test enable signal in an integrated circuit, and receiving test result signals output from the integrated circuit in response to the test enable signal may be further performed. Additionally, a step of preparing a data set for training a machine learning model and a step of training the machine learning model using the data set may be further performed.

Referring to FIG. 9, at operation S10, frequencies of test result signals by each of ring oscillators may be obtained, the ring oscillators including test patterns formed on a specific metal layer from among a plurality of metal layers formed in an integrated circuit. In some embodiments, in the ring oscillators, lengths of test patterns electrically connecting inverters with each other may be different from each other, and thus, frequencies of test result signals by the ring oscillators may be different from each other. For example, as described with reference to FIG. 6A, the test apparatus 20 may receive a first test result signal according to a first clock signal CLK11 which is generated in the first ring oscillator RO11 including the first test patterns CON1 formed in the first metal layer M1 and extending in a first length D1, and may receive a second test result signal according to a second clock signal CLK12 which is generated in the second ring oscillator RO12 including the second test patterns CON2 formed in the first metal layer M1 and extending in a second length D2. The test apparatus 20 may obtain a first frequency of the first test result signal and a second frequency of the second test result signal.

In an example embodiment, at operation S10, a common frequency of a test result signal by a common ring oscillator may be further obtained. A common test pattern included in the common ring oscillator may be the same metal layer as the specific metal layer, or may be a different metal layer from the specific metal layer.

At operation S20, machine learning may be performed using the frequencies of the test result signals. The performing of the machine learning may include performing an inference operation using a machine learning model. At operation S30, a resistance value and capacitance value of a corresponding specific metal layer may be extracted. The machine learning model for extracting the resistance value and capacitance value of the metal layer may be stored in the storage apparatus (27 of FIG. 8) of the test apparatus 20, and a resistance value and capacitance value of a pattern of a specific metal layer may be extracted from the frequencies of the test result signals by using the machine learning model. By performing operations S10 to S30 on each of the plurality of metal layers of the integrated circuit, a resistance value and capacitance value of a pattern of the plurality of metal layers may all be extracted from the test result signals.

In the manufacturing method for the integrated circuit according to the inventive concept, because a resistance value and capacitance value of a pattern of each of a plurality of metal layers on which lines electrically connecting integrated circuit elements are formed are extracted through machine learning, the accuracy of the extracted resistance value and the extracted capacitance value may be improved, and the electrical characteristics and timing characteristics of the integrated circuit may be more accurately estimated.

Figure 10:
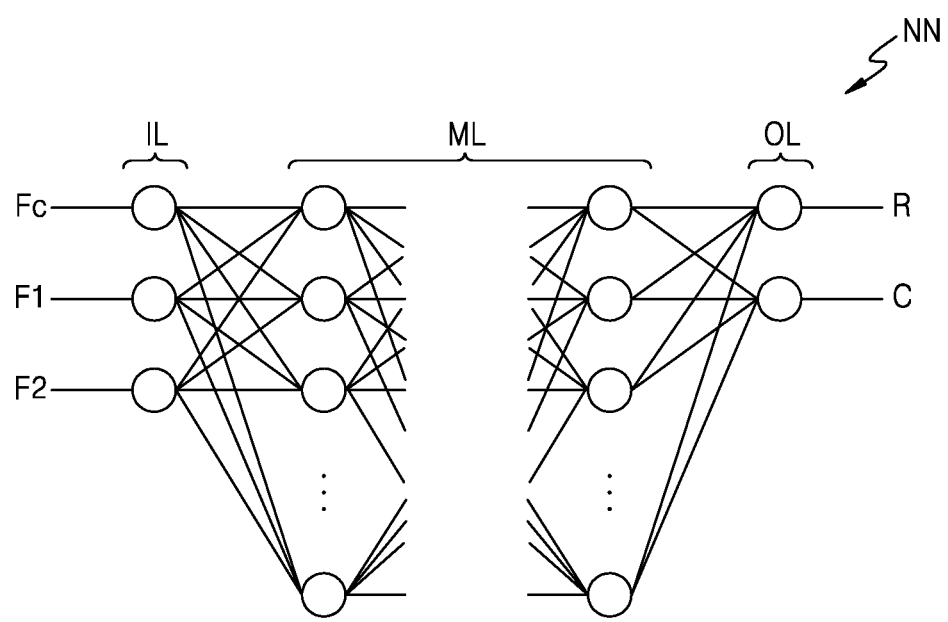
FIG. 10 is a diagram illustrating operation S20 of FIG. 9, and is a diagram illustrating a machine learning operation using a machine learning model.

FIG. 10 is a diagram illustrating operation S20 of FIG. 9 and illustrates a machine learning operation using a machine learning model.

Referring to FIGS. 8 and 10, the test apparatus 20 may receive a first frequency F1, a second frequency F2, and a common frequency Fc of test result signals for extracting electrical characteristics of a specific metal layer from among a plurality of metal layers of the integrated circuit. The test apparatus 20 extract a resistance value R and a capacitance value C of a pattern of the specific metal layer from the first frequency F1, the second frequency F2, and the common frequency Fc of the test result signals through an inference operation using a machine learning model.

For example, as described with reference to FIG. 6A, the test apparatus 20 may receive a first test result signal according to a first clock signal CLK11 which is generated in the first ring oscillator RO11 including the first test patterns CON1 formed in the first metal layer M1 and extending by the first length D1, and may receive a second test result signal according to a second clock signal CLK12 which is generated in the second ring oscillator RO12 including the second test patterns CON2, the second test patterns CON2 being formed in the first metal layer M1 and extending by the second length D2. The test apparatus 20 may obtain a first frequency F1 of the first test result signal and a second frequency F2 of the second test result signal. In addition, the common frequency Fc of a test result signal by the common ring oscillator may be obtained.

The machine learning model may include, for example, a linear regression model, a polynomial regression model, a random forest model, multilayer perceptron (fully connected neural network), a neural network model, a deep learning model, or reinforcement learning. The neural network model may include, for example, a convolutional neural network model or a recurrent neural network model. In FIG. 10, a neural network model NN as a deep neural network is described as an example of the machine learning model, but the inventive concept is not limited thereto.

The neural network model NN may include a multi-layer including an input layer IL, one or more intermediate layers ML, and an output layer OL. The input layer IL may receive input values (for example, the frequencies F1, F2, and Fc of the test result signals), and the output layer OL may generate an estimated output value, for example, a resistance value R and a capacitance value C of a pattern of a specific metal layer (for example, the first metal layer M1).

Each layer of the neural network model NN may include a plurality of nodes herein also referred to as neurons. Each of the nodes or neurons may indicate a calculation unit having one or more inputs and outputs. Each input from a plurality of nodes of a layer may be supplied from each node of an adjacent layer. Similarly, an output may be supplied to the plurality of nodes of the adjacent layer.

In an example embodiment, the input layer IL may have three nodes, each of the intermediate layers ML may have i (i is a natural number) nodes, and the output layer OL may have two nodes. Each node of a network may be connected to all of nodes of an adjacent layer. The number (i) of nodes of the intermediate layers ML may be changed according to an application of the neural network model NN. In some embodiments, only two intermediate layers ML having the same number of nodes are shown. The present invention is not limited thereto. In some embodiments, an arbitrary number of intermediate layers may be present, and the number of nodes included in each of the intermediate layers may be different from each other, without departing from the scope of the inventive concept.

Figure 11:
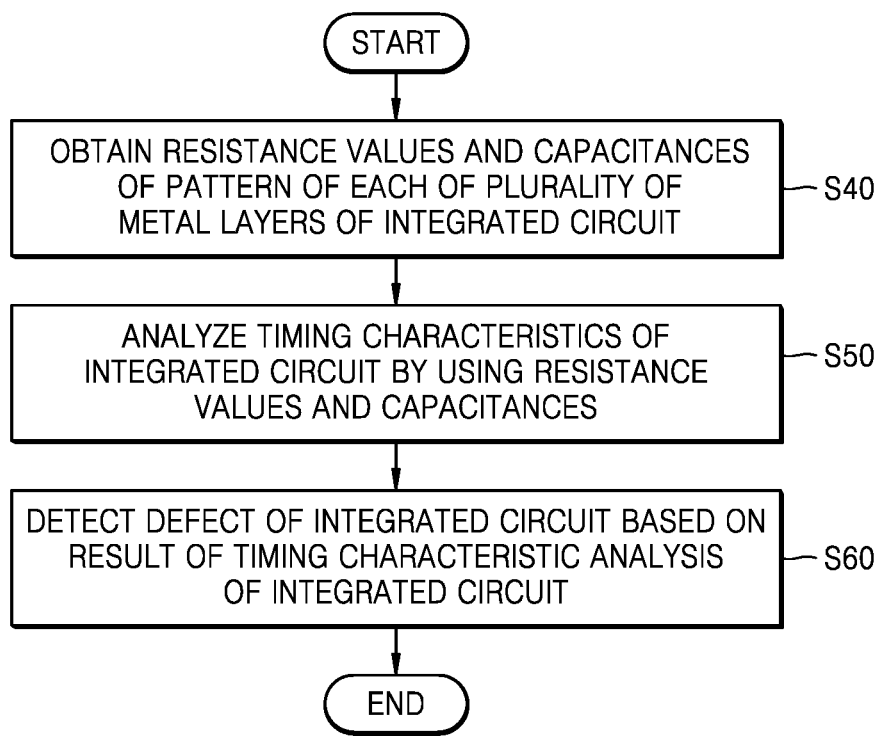
FIG. 11 is a flowchart of a method of manufacturing an integrated circuit, according to an embodiment of the inventive concept.

FIG. 11 is a flowchart of a method of manufacturing an integrated circuit, according to an embodiment of the inventive concept. Operations S40 to S60 of FIG. 11 may be performed in the test apparatus 20 of FIG. 1, and may be performed after operation S30 of FIG. 9.

Referring to FIG. 11, at operation S40, resistance values and capacitance values of patterns of each of a plurality of metal layers of an integrated circuit may be obtained. At operation S50, timing characteristics of the integrated circuit may be analyzed using the resistance values and the capacitance values of each of the plurality of metal layers. The "timing characteristic analysis" may refer to an operation of determining whether timing paths included in an integrated circuit satisfy timing constraints, and identifying, according to a result of the determining, a timing path in which an entire timing delay from an input (that is, a start point) to an output (that is, an end point) exceeds a timing requirement from among the timing paths, or a timing critical path of the integrated circuit. The timing constraints may include setup timing constraints and hold timing constraints.

At operation S60, a defect of the integrated circuit may be detected based on a result of the timing characteristic analysis of the integrated circuit. In some embodiments, characteristic analysis of integrated circuit devices included in the integrated circuit may be further performed. When the timing characteristics of the integrated circuit satisfy a reference requirement, it may be determined that there is no defect in the integrated circuit, and the method of manufacturing the integrated circuit may be completed.

Figure 12:
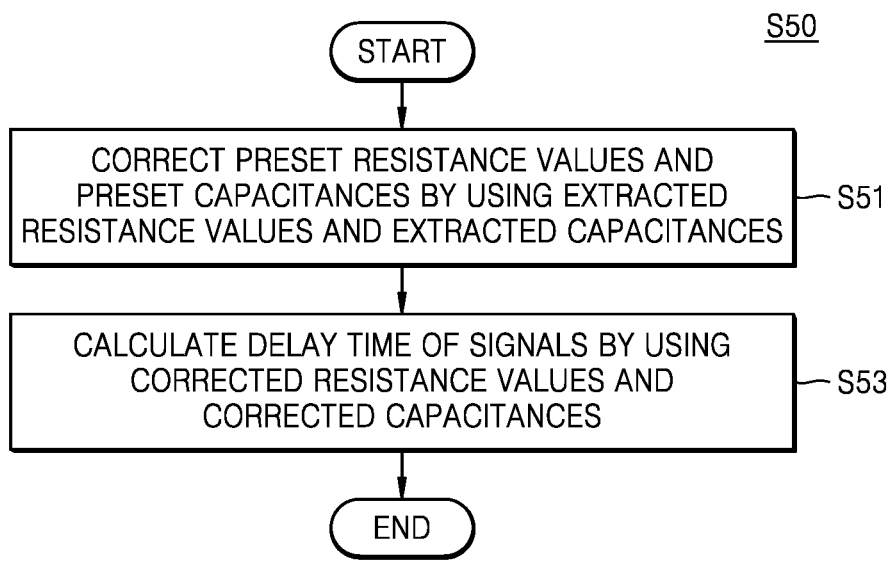
FIG. 12 is a flowchart of a method of manufacturing an integrated circuit, according to an embodiment of the inventive concept.
Figure 13:
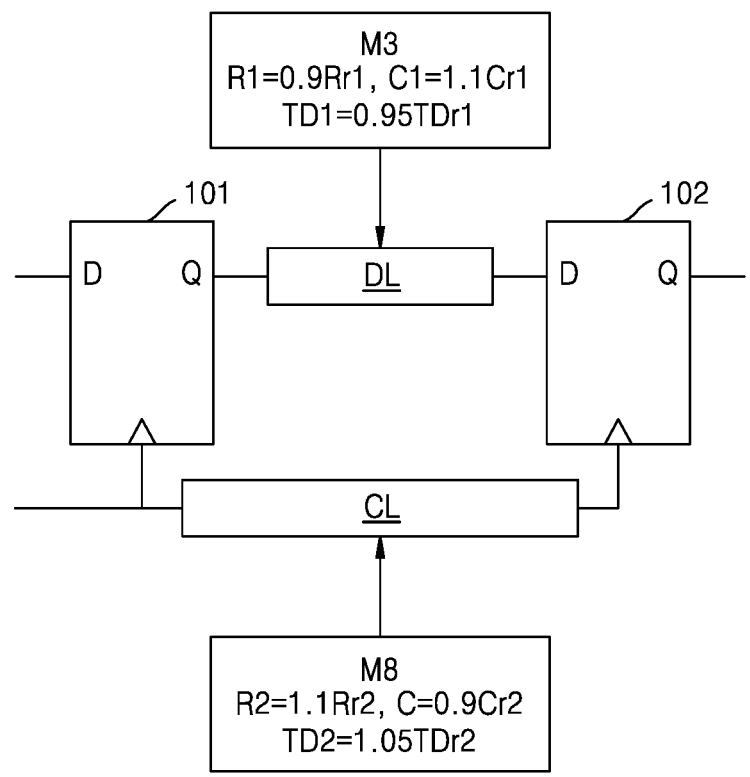
FIG. 13 is a diagram illustrating each of operations of FIG. 12, and illustrates an integrated circuit including synchronization circuits.

FIG. 12 is a flowchart of a method of manufacturing an integrated circuit, according to an embodiment of the inventive concept. FIG. 13 is a diagram illustrating each operation of FIG. 12 and illustrates an integrated circuit including synchronization circuits. FIG. 12 is an example of operation S50 of FIG. 11, and operation S50 may include operations S51 and S53.

Referring to FIGS. 12 and 13, at operation S51, preset resistance values and preset capacitance values may be corrected using the extracted resistance values and the extracted capacitance values in the timing characteristic analysis. At operation S53, a delay time of signals input or output between the elements included in the integrated circuit device may be calculated using the corrected resistance values and the corrected capacitance values. Timing characteristics of the integrated circuit may be analyzed based on the obtained delay time.

For example, the integrated circuit 10 may include a first synchronization circuit 101 and a second synchronization circuit 102, and each of the first synchronization circuit 101 and the second synchronization circuit 102 may include an input pin D for receiving a data input signal, may include an output pin Q for outputting a data output signal according to the data input signal, and may include a clock pin for receiving a clock signal.

A line connecting from the output pin Q of the first synchronization circuit 101 to the input pin D of the second synchronization circuit 102 may be defined as a data line DL. For example, the data line DL may be formed as a pattern of the third metal layer M3, and a preset resistance value Rr1 and the preset capacitance value Cr1 of the data line DL may be corrected to a resistance value R1 and capacitance value C1 obtained at operation S40 of FIG. 11. For example, the obtained resistance value R1 may be about 0.9 times the preset resistance value Rr1, and the obtained capacitance value C1 may be about 1.1 times the preset capacitance value Cr1. A delay time TD1 of the data line DL may be calculated using the corrected resistance value R1 and the corrected capacitance value C1. The obtained delay time TD1 may be about 0.95 times a delay time TDR1 estimated at a previous step. For example, the delay time TDR1 may include a delay time estimated in the design step for the integrated circuit.

A line connecting from the clock pin of the first synchronization circuit 101 to the clock pin of the second synchronization circuit 102 may be defined as a clock line CL. For example, the clock line CL may be formed as a pattern of the eighth metal layer M8, and a preset resistance value Rr2 and the preset capacitance value Cr2 of the clock line CL may be corrected to a resistance value R2 and capacitance value C2 obtained at operation S40 of FIG. 11. For example, the obtained resistance value R2 may be about 1.1 times the preset resistance value Rr2, and the obtained capacitance value C2 may be about 0.9 times the preset capacitance value Cr2. A delay time TD2 of the clock line CL may be calculated using the corrected resistance value R2 and the corrected capacitance value C2. The obtained delay time TD2 may be about 1.05 times a delay time TDR2 estimated at a previous step. For example, the delay time TDR2 may include a delay time estimated in the design step for the integrated circuit.

While the inventive concept has been particularly shown and described with reference to embodiments thereof, it will be understood that various changes in form and details may be made therein without departing from the spirit and scope of the following claims.

What is claimed is:

1. An integrated circuit comprising:
    first to $n^{th}$ metal layers vertically stacked on a substrate; and
    a test circuit configured to output a test result signal according to a characteristic of each of the first to $n^{th}$ metal layers,
    wherein the test circuit comprises:
        first to $n^{th}$ test circuits configured to generate a plurality of clock signals, each clock signal of the plurality of clock signals having a frequency according to a characteristic of a corresponding metal layer among the first to $n^{th}$ metal layers, and
    wherein n is a natural number,
    wherein each of the first to $n^{th}$ test circuits comprises a first ring oscillator and a second ring oscillator,
    wherein a frequency of a first clock signal output from the first ring oscillator and a frequency of a second clock signal output from the second ring oscillator are different from each other,
    wherein the first ring oscillator comprises a plurality of inverters connected with each other using a first test pattern formed in a corresponding metal layer of the first to $n^{th}$ metal layers,
    wherein the second ring oscillator comprises a plurality of inverters connected with each other using a second test pattern formed in the corresponding metal layer of the first to $n^{th}$ metal layers, and
    wherein an extension length of the first test pattern and an extension length of the second test pattern are different from each other.

2. The integrated circuit of claim 1,
    wherein the test circuit further comprises a common ring oscillator,
    wherein the common ring oscillator comprises a plurality of inverters connected with each other using a common test pattern formed in one metal layer among the first to $n^{th}$ metal layers, and
    wherein an extension length of the common test pattern is less than each of the extension length of the first test pattern and the extension length of the second test pattern.

3. The integrated circuit of claim 1,
    wherein the first ring oscillator further comprises a ground line which is adjacent to the first test pattern to electrically shield the first test pattern and receives a ground voltage.

4. The integrated circuit of claim 1,
    wherein the test circuit comprises:
    a decoder configured to provide an enable signal to the first to $n^{th}$ test circuits in response to a selection signal;
    a multiplexer configured to receive the plurality of clock signals from the first to $n^{th}$ test circuits, and output a clock signal in response to the selection signal; and
    a frequency divider configured to output the test result signal by adjusting a frequency of the clock signal.

5. The integrated circuit of claim 1,
    wherein a width, in a first horizontal direction, of a pattern of a first metal layer among the first to $n^{th}$ metal layers is less than a width, in a second horizontal direction, of a pattern of an $n^{th}$ metal layer among the first to nth metal layers,
    wherein the first metal layer is a lowest metal layer among the first to $n^{th}$ metal layers, and the $n^{th}$ metal layer is a highest metal layer among the first to nth metal layers, and
    wherein the first horizontal direction is perpendicular to or parallel to the second horizontal direction.

6. The integrated circuit of claim 1,
    wherein a thickness, in a vertical direction, of a pattern of a first metal layer among the first to $n^{th}$ metal layers is less than a thickness, in the vertical direction, of a pattern of an $n^{th}$ metal layer among first to $n^{th}$ metal layers, and
    wherein the first metal layer is a lowest metal layer among the first to $n^{th}$ metal layers, and the $n^{th}$ metal layer is a highest metal layer among the first to nth metal layers.

7. The integrated circuit of claim 1,
    wherein patterns of the first to $n^{th}$ metal layers comprise a same material as each other.

8. An integrated circuit comprising a test circuit,
    wherein the test circuit comprises:
    a first ring oscillator comprising a plurality of inverters connected with each other using a first test pattern formed in a first metal layer among a plurality of metal layers that are vertically stacked on each other; and
    a second ring oscillator comprising a plurality of inverters connected with each other using a second test pattern formed in the first metal layer,
    wherein an extension length of the first test pattern of the first metal layer and an extension length of the second test pattern of the first metal layer are different from each other.

9. The integrated circuit of claim 8,
    wherein the test circuit further comprises:
    a common ring oscillator which comprises a plurality of inverters connected with each other using a common test pattern formed in the first metal layer, and
    wherein an extension length of the common test pattern is different from each of an extension length of the first test pattern and an extension length of the second test pattern.

10. The integrated circuit of claim 8,
    wherein the test circuit further comprises:
    a common ring oscillator which comprises a plurality of inverters connected with each other using a common test pattern formed in a different layer, among the plurality of metal layers, from the first metal layer, and
    wherein an extension length of the common test pattern is less than each of an extension length of the first test pattern and an extension length of the second test pattern.

11. The integrated circuit of claim 8,
wherein the test circuit further comprises:
a third ring oscillator comprising a plurality of inverters connected with each other using a third test pattern formed in a second metal layer, among the plurality of metal layers, different from the first metal layer; and
a fourth ring oscillator comprising a plurality of inverters connected with each other using a fourth test pattern formed in the second metal layer, and
wherein an extension length of the third test pattern of the second metal layer and an extension length of the fourth test pattern of the second metal layer are different from each other.

12. The integrated circuit of claim 8,
wherein the first ring oscillator outputs a first clock signal having a first frequency, and
wherein the second ring oscillator outputs a second clock signal having a second frequency different from the first frequency.

13. A method of manufacturing an integrated circuit comprising a plurality of metal layers, the method comprising:
obtaining frequencies of test result signals from a plurality of ring oscillators in a plurality of test circuits, wherein each test circuit includes at least two ring oscillators having test patterns formed in a specific metal layer among the plurality of metal layers, and wherein the test patterns are different in extension lengths thereof; and
extracting a resistance value and a capacitance value of a pattern formed in the specific metal layer by performing machine learning on the frequencies of the test result signals.

14. The method of claim 13,
wherein the obtaining of the frequencies of the test result signals and the extracting of the resistance value and the capacitance value of the pattern formed in the specific metal layer are performed on each of the plurality of metal layers.

15. The method of claim 13, further comprising:
analyzing timing characteristics of the integrated circuit by using the extracted resistance value and the extracted capacitance value; and
detecting a defect of the integrated circuit based on a result of the analysis of the timing characteristics of the integrated circuit.

16. The method of claim 15,
wherein the analyzing of the timing characteristics of the integrated circuit comprises:
correcting a preset resistance value and a preset capacitance value by using the extracted resistance value and the extracted capacitance value; and
calculating a delay time of signals input or output between circuit elements of the integrated circuit, by using the corrected resistance value and the corrected capacitance value.

17. The method of claim 13,
wherein the obtaining of the frequencies of the test result signals comprises obtaining a frequency of a test result signal from a common ring oscillator which comprises common test patterns formed in a different metal layer from the specific metal layer among the plurality of metal layers.

18. The method of claim 17,
wherein an extension length of the common test patterns is less than an extension length of the test patterns.

* * * * *